United States Patent [19]

Seiwa

[11] Patent Number: 5,116,769
[45] Date of Patent: May 26, 1992

[54] METHOD OF PRODUCING A SEMICONDUCTOR LASER BY IMPLANTING IMPURITIES WHICH SUPPRESS DISORDERING

[75] Inventor: Yoshito Seiwa, Itami, Japan

[73] Assignee: Mitsubishi Denki Kabushiki Kaisha, Itami, Japan

[21] Appl. No.: 673,319

[22] Filed: Mar. 22, 1991

Related U.S. Application Data

[62] Division of Ser. No. 492,838, Mar. 13, 1990, Pat. No. 5,034,954.

[30] Foreign Application Priority Data

Oct. 20, 1989 [JP] Japan .................. 1-274614

[51] Int. Cl.⁵ .................................. H01L 21/20
[52] U.S. Cl. ............................ 437/22; 437/129
[58] Field of Search .............. 372/45; 437/129, 22; 148/DIG. 95

[56] References Cited

U.S. PATENT DOCUMENTS

| | | | |
|---|---|---|---|
| 4,366,568 | 12/1982 | Shimizu et al. | 437/129 |
| 4,488,306 | 12/1984 | Sugino et al. | 437/129 |
| 4,494,995 | 11/1985 | Tabatabaie-Alvarii et al. | 437/22 |
| 4,957,879 | 9/1990 | Omura et al. | 437/129 |
| 5,020,068 | 5/1991 | Isshiki | 372/46 |

OTHER PUBLICATIONS

"Microstructure Semiconductor . . . Integrated Circuit", Scientific Monthly Report, vol. 41, No. 11, pp. 910-913.

Primary Examiner—Olik Chaudhuri
Assistant Examiner—Long Pham
Attorney, Agent, or Firm—Leydig, Voit & Mayer

[57] ABSTRACT

A semiconductor laser device including a substrate containing a groove through which the laser light is emitted, a first layer disposed between the substrate and an active layer including a superlattice region opposite the groove and having the same conductivity type as the region in the sides walls of the groove and a disordered region in the first layer adjacent the superlattice of a different conductivity type from that of the superlattice region for confining current flow from the substrate to the active layer. A method of producing the semiconductor laser device includes implanting impurity ions which change the conductivity type but suppress the disordering of the superlattice region after annealing. The ions are implanted through the groove and produce the desired conductivity type region in the side walls of the groove.

6 Claims, 4 Drawing Sheets (a)

(b)

5,116,769

METHOD OF PRODUCING A SEMICONDUCTOR LASER BY IMPLANTING IMPURITIES WHICH SUPPRESS DISORDERING

This application is a division of application Ser. No. 07/492,838, filed Mar. 13, 1990, now U.S. Pat. No. 5,034,954.

FIELD OF THE INVENTION

The present invention relates to a surface light emitting type semiconductor laser device and a production method thereof and, more particularly, to a laser having a low threshold current and achieving fundamental mode oscillation.

BACKGROUND OF THE INVENTION

In recent years, as a key device for high speed parallel optical information processing surface light emitting type semiconductor laser devices, which emit laser light perpendicular to the substrate, have been advanced.

FIG. 5 shows, in cross-section, a surface light emitting type semiconductor laser device having an AlAs/AlGaAs multilayer reflection mirror, disclosed in "Monthly Report of Science", vol. 41, No. 11, pp. 910 to 913, by Professor Iga of the Tokyo Institute of Technology. In FIG. 5, 1 is an n type GaAs substrate. An n type $Al_{0.3}Ga_{0.7}As$ etch stop layer 2 is disposed on the substrate 1. An n type multilayer film 3 is disposed on the etch stop layer 2. This multilayer film 3 comprises twenty pairs of AlAs and $Al_{0.1}Ga_{0.9}As$ layers, where the thicknesses of the respective layers are to:

$$\frac{(wavelength)}{4 \cdot (refractive\ index)}$$

For example, when the wavelength is 880 nm, the AlAs layer is 741 angstroms thick and the $Al_{0.1}Ga_{0.9}As$ layer is 625 angstroms thick. A p type GaAs active layer 4 is disposed on the multilayer film 3. An active region 31 is disposed at the center of active layer 4. A p type $Al_{0.3}Ga_{0.7}As$ cladding layer 5 is disposed on the active layer 4. A p type GaAs contact layer 6 is disposed on a portion of the cladding layer 5. A SiN insulating film 7 is disposed on the cladding layer 5 and a circular SiN insulating film 7b is disposed on a portion of the contact layer 6. A p side electrode 9a is disposed on the insulating films 7 and 7b, and an n side electrode 10a is disposed on the rear surface of substrate 1. Reference numeral 8 denotes a circular mesa groove. Reference numerals 26a and 26b denote crystal surfaces constituting a pair of resonator facets.

This surface light emitting type laser device will operate as follows.

Holes and electrons which are injected into the device from p side electrode 9a and n side electrode 10a are effectively confined in the active layer 4 by the heterojunction barrier between the GaAs active layer 4 and the $Al_{0.3}Ga_{0.7}As$ cladding layer 5 and the heterojunction barrier between the GaAs active layer 4 and the multilayer film 3, and recombine to generate light having a wavelength corresponding to the energy band gap of the active layer 4. The generated light increases as the current level is increased. When the current reaches a certain value (threshold value), the gain exceeds the loss and produces laser oscillation and light is emitted from the cavity facet 26a. In order to lower the threshold value, it is necessary to reduce the loss. In order to reduce the loss, a method of increasing the reflectances of the resonator facets 26a and 26b is considered. In this prior art laser device, the AlGaAs/AlAs multilayer film 3 and the circular SiN film 7b are provided to increase the reflectances of the resonator facets. Herein, the thickness of SiN film 7b is set to 1000 to 1900 angstroms.

In the prior art surface light emitting type laser device of such a construction, reduction of threshold value is attempted by utilizing the multilayer film 3 and the SiN film 7b. However, since there is no confinement structure for confining the carriers to the active region 31, the carriers injected from the substrate side electrode 10a (in this device, electrons), are dispersed as shown in FIG. 7. A and reactive current which does not contribute to the oscillation is generated, whereby the threshold current is likely to increase. In addition, since the reflectance of the multilayer film 3 is approximately the same for the light of different oscillation modes, mode control is difficult.

SUMMARY OF THE INVENTION

An object of the present invention is to provide a surface light emitting type semiconductor laser device having a low threshold current and capable of obtaining a fundamental mode oscillation.

It is another object of the present invention to provide a production method for such a device.

Other objects and advantages of the present invention will become apparent from the detailed description given hereafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor laser device includes a superlattice layer disposed between an active layer and a cavity facet at the substrate side at a circular mesa groove. The groove provides a current path and has a high reflectance for the a laser light. A disordered layer disposed outside the groove between the active layer and the substrate blocks current flow and has a low reflectance for the laser light. Therefore, the dispersion of carriers injected from the substrate side electrode is suppressed, thereby lowering the threshold current. Furthermore, since the disordered layer has a reflectance lower than that of the superlattice layer, the reflectance of higher order oscillation mode light, which has a high light intensity distribution at the periphery of the active region, is lower than the reflectance of the fundamental oscillation mode light, which has a high light intensity distribution at the center of the active region. The laser device is not likely to oscillate at the higher order mode, thereby controlling the oscillation mode.

According to another aspect of the present invention, a method of producing a semiconductor laser device includes successively epitaxially growing a first or second conductivity type etching stopping layer, a first conductivity type superlattice layer, a second conductivity type cladding layer, an active layer, and a first conductivity type cladding layer on a first conductivity type substrate, producing a current confinement structure at the side of the first conductivity type cladding layer, etching a groove that reaches the etching stopping layer at a region of the substrate opposite the current confinement structure implanting dopant impurity ions that suppress the disordering of the superlattice layer during annealing and are activated to a second conductivity type by annealing, from the side of the substrate where the groove is produced, so that the ions reach the second conductivity type cladding layer in the groove and remain in the substrate said groove side walls, and disordering the superlattice layer at a region where the impurity ions are not implanted. Therefore, a laser structure has a superlattice region which becomes a current path and a disordered region surrounding the superlattice region to block a current flow.

DETAILED DESCRIPTION OF THE PREFERRED EMBODIMENTS

An embodiment of the present invention will be described in detail with reference to the drawings.

Figure 1:
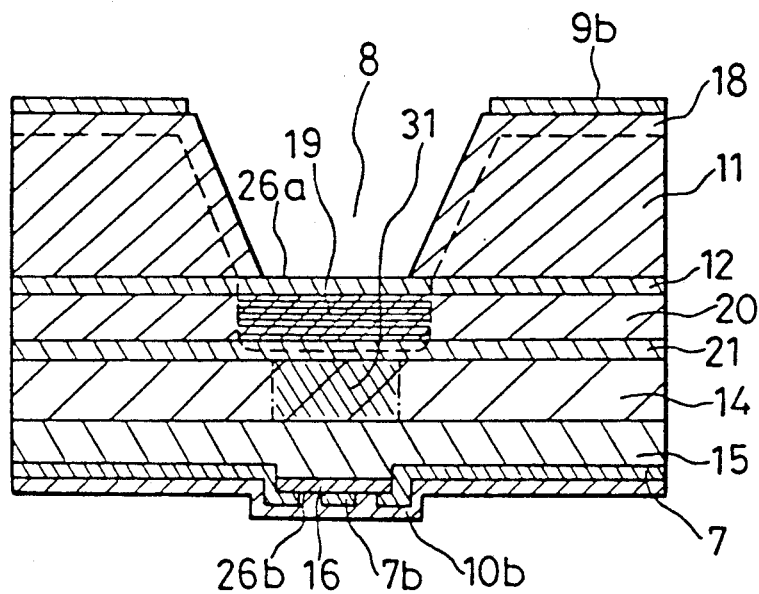
FIG. 1 is a cross-sectional view showing a surface light emitting type semiconductor laser device according to a first embodiment of the present invention.
Figure 5:
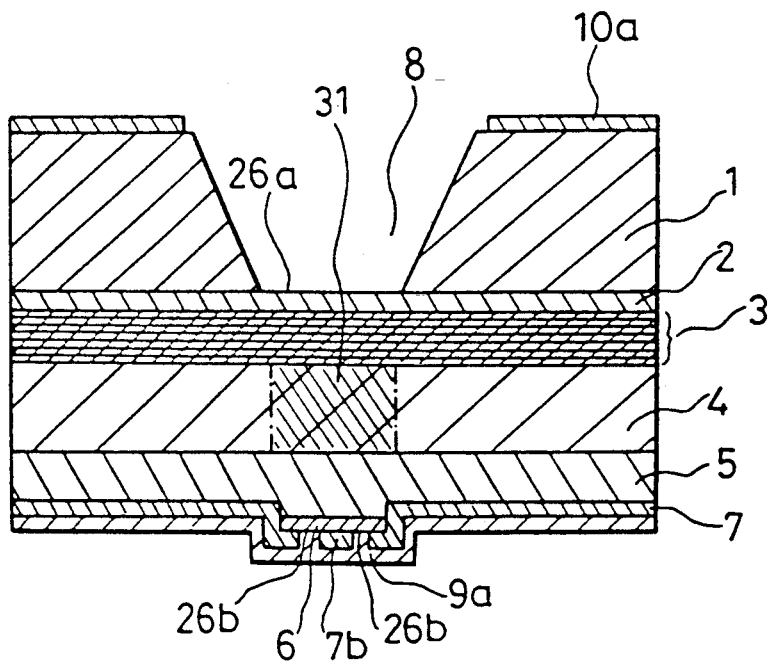
FIG. 5 is a cross-sectional view showing an example of a prior art surface light emitting type laser device.

FIG. 1 shows, in cross-section, a surface light emitting type semiconductor laser device according to a first embodiment of the present invention. In FIG. 1, reference numeral 11 denotes a high resistance n type GaAs substrate. An n type $Al_{0.4}Ga_{0.6}As$ etching stopping layer 12 0.3 microns thick is disposed on the substrate 11. A p type superlattice layer 19 comprising fifty pairs of AlAs and $Al_{0.1}Ga_{0.9}As$ layers is disposed on the etch stop layer 12. Herein, the thickness of AlAs layer $t_1$ is 90 angstroms and the thickness of $Al_{0.1}Ga_{0.9}As$ layer $t_2$ is 160 angstroms, where the refractive index of the AlAs layer of thickness $t_1$ is smaller than the refractive index of the $Al_{0.1}Ga_{0.9}As$ layer of thickness $t_2$. An n type $Al_{0.4}Ga_{0.6}As$ layer 20, produced by disordering part of the superlattice layer 19, is disposed on the etching stopping layer 12. A p type $Al_{0.4}Ga_{0.6}As$ cladding layer 21 0.265 microns thick (wavelength/refractive index) is disposed on the layer 20 including the superlattice layer 19. A p type GaAs active layer 14 of 2 microns thickness is disposed on the cladding layer 21. An active region 31 is produced at the center of the active layer 14. An n type $Al_{0.4}Ga_{0.6}As$ cladding layer 15 1 micron thick is disposed on the active layer 14. An n type GaAs contact layer 16 is disposed on a portion of the cladding layer 15. A SiN insulating film 7 is disposed on the cladding layer 15, and a circular SiN insulating film 7b 10 microns in diameter, which also functions as reflection layer, is disposed on a portion of the contact layer 6. An n side electrode 10b is disposed on the insulating films 7 and 7b, and a p side electrode 9b is disposed on the rear surface of substrate 11. Reference numeral 8 denotes a circular mesa groove 20 microns in diameter. Reference numeral 18 denotes a p type impurity diffusion region in which the diffusion front in the circular mesa groove 8 extends into the p type $Al_{0.4}Ga_{0.6}As$ cladding layer 21. Reference numerals 26a and 26b denote crystal surfaces comprising a pair of resonator facets. The superlattice layer 19 adjacent the p type cladding layer 21 is an AlAs layer.

A production method of this laser device will be described.

Figure 2:
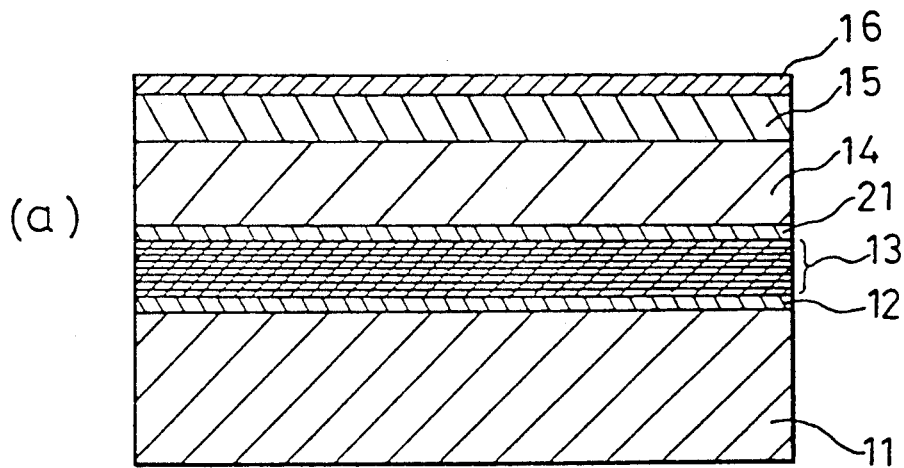
FIGS. 2(a) and 2(b) are diagrams showing a process for producing the surface light emitting type laser device of FIG. 1.
Figure 2:
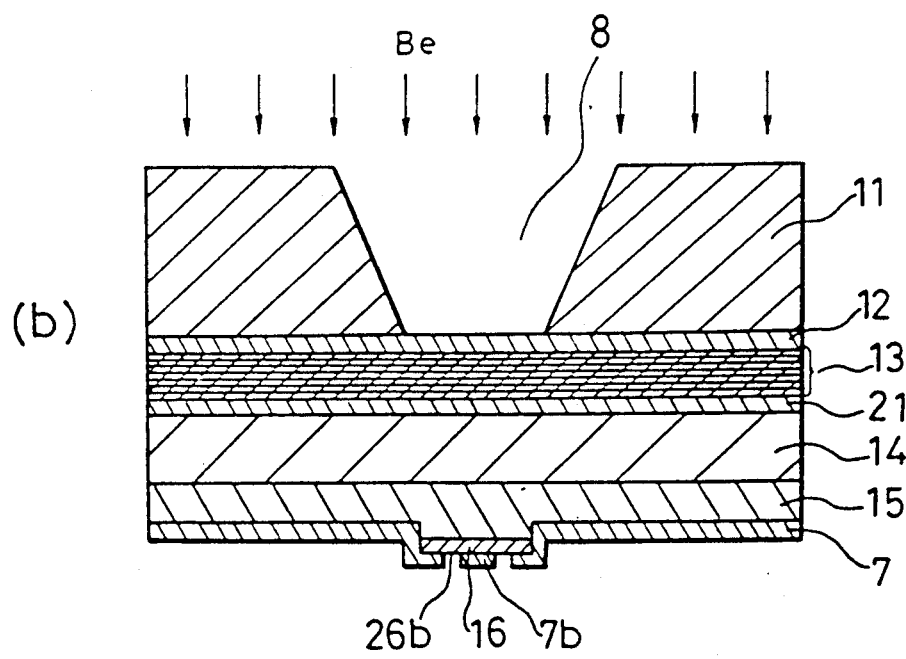

FIGS. 2(a) and 2(b) are cross-sectional views showing a method for producing the surface light emitting type semiconductor laser device of FIG. 1.

First of all, as shown in FIG. 2(a), an etching stopping layer 12, an n type AlGaAs/AlAs superlattice layer 13 containing silicon as a dopant, a p type cladding layer 21, a p type active layer 14, an n type cladding layer 15, and an n type contact layer 16 are successively grown on a high resistance n type GaAs substrate 11. Subsequently, all but a limited portion of the n type contact layer 16 and part of the n type cladding layer 15 are removed to confine current flow. Thereafter, the substrate 11 is etched to produce a circular mesa groove 8. The etching is limited by etching stopping layer 12 to avoid damage to the superlattice layer 13.

Next, as shown in FIG. 2(b), Be ions (p type dopants) are implanted into the surface including the circular mesa groove 8. Thereafter, the structure is annealed to produce the p type impurity diffusion region 18 of FIG. 1. Herein, silicon promotes the disordering of the superlattice layer during annealing, but be suppresses disordering. Accordingly, after the annealing, the region in which Be ions are implanted becomes a p type and remains as the AlGaAs/AlAs superlattice region 19 and the region in which Be ions are not implanted becomes the n type AlGaAs disordered layer 20.

The device will operate as follows.

Figure 6:
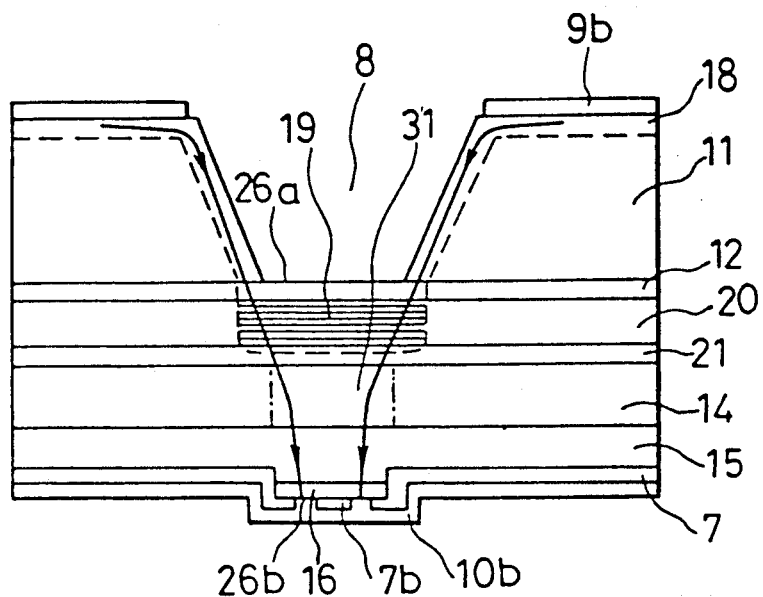
FIG. 6 is diagram showing a current flow in the first embodiment of the present invention.
Figure 7:
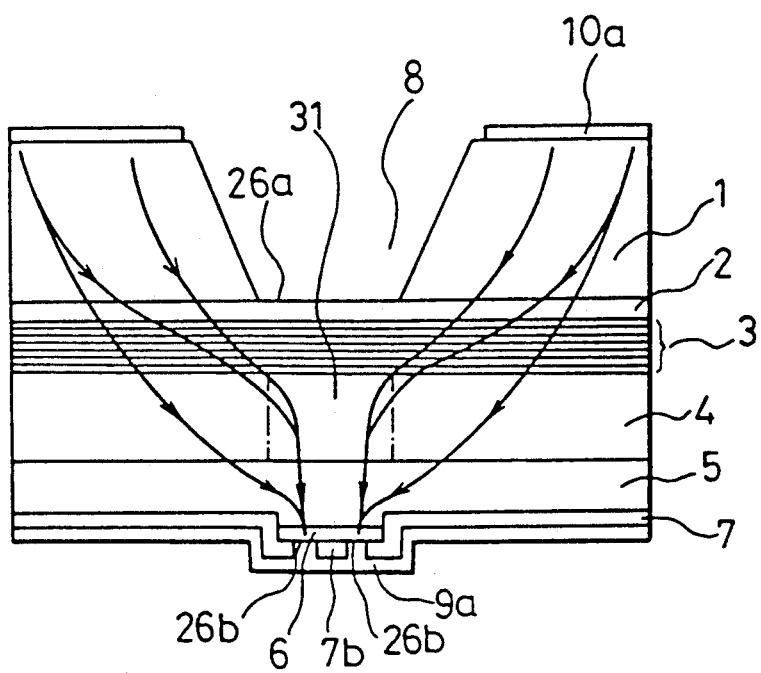
FIG. 7 is diagram showing a current flow in the prior art surface light emitting type laser device.

When carriers are injected into the laser device from the p side electrode 9b and the n side electrode 10b, the current path of the carriers which are injected from the substrate side electrode 9b (in this embodiment, holes) are confined in the p type AlGaAs/AlAs superlattice layer 19 by the n type disordered layer 20, as shown in FIG. 6. That is, a current confinement structure is realized not only for electrons but also for hole. Electron flow is confined by the insulating film 7. Hole flow is confined to path by the p type impurity diffusion region 18 and by the n type disordered layer 20 thereby reducing the threshold current. Furthermore, the reflectance of light produced at the active region 31 is high at the AlGaAs/AlAs superlattice layer 19 but low at the disordered layer 20. The light which has transitted the disordered layer 20 is absorbed by the GaAs substrate 11. Accordingly, the reflectance of the fundamental oscillation mode light, which has a large electric field at the center of the active region 31, is high and the laser is likely to oscillate at this mode. However, the reflectance of the higher order oscillation mode light, which has a large electric field at the periphery of the active region 31, is low and laser oscillation is not likely at the higher order mode. From the above-described mechanism, the oscillation can be controlled toward the fundamental mode in this embodiment.

In the above-illustrated embodiment, Si is selected as the impurity for promoting disordering and Be is selected as the impurity for suppressing disordering, but other combinations of impurities may be employed.

While in the above-illustrated embodiment the etching stopping layer 12 is n type, it may be p type.

Figure 3:
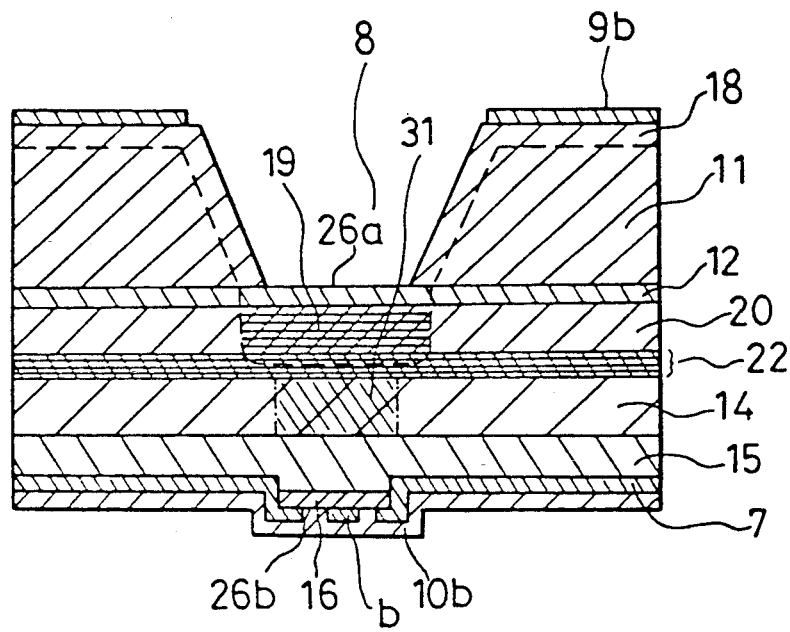
FIG. 3 is a cross-sectional view showing a surface light emitting type laser device according to a second embodiment of the present invention.

FIG. 3 shows, in cross-section, a structure of a laser device according to a second embodiment of the present invention. In FIG. 3, the same reference numerals denote the same or corresponding portions as those shown in FIG. 1. In this second embodiment, the p type $Al_{0.4}Ga_{0.6}As$ cladding layer 21, which is disposed on the active layer 14 in the first embodiment, is replaced by a p type AlGaAs/AlAs superlattice layer 22 contain Be dopant ions.

The production process of this second embodiment is the same as that of the first embodiment except for that the Be doped p type AlGaAs/AlAs superlattice layer 22 remains as a superlattice structure, even after the annealing. Therefore, the reflectance of the peripheral region of the active region is increased as compared with the first embodiment. However, since the reflectance increases with the thickness of the superlattice layer, i.e., as the number of layers increases, the reflectance of the central portion of the active region, where the superlattice layer 19 is disposed on the superlattice layer 22, is higher than elsewhere, and a mode selecting function is achieved as in the first embodiment.

Figure 4:
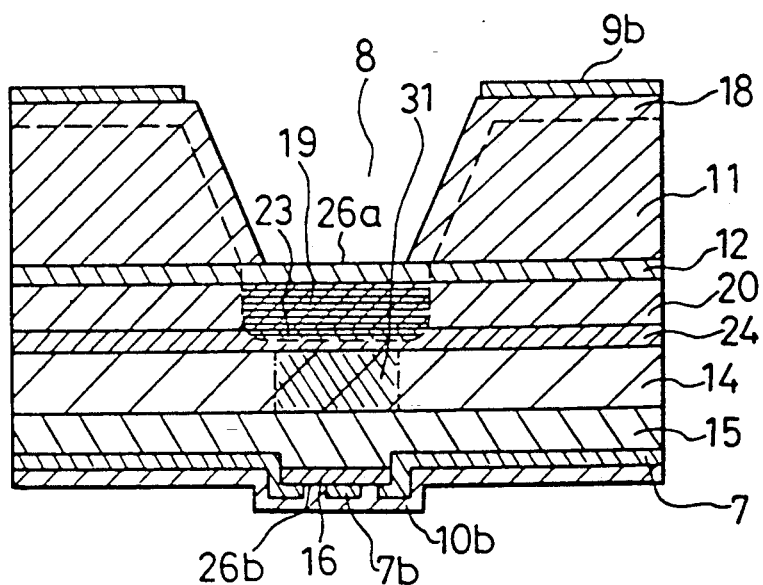
FIG. 4 is a cross-sectional view showing a surface light emitting type laser device according to a third embodiment of the present invention.

FIG. 4 shows, in cross-section, a structure of a laser device according to a third embodiment of the present invention. In FIG. 4, the same reference numerals denote the same or corresponding portions as those shown in FIG. 1. In this third embodiment, the p type $Al_{0.4}Ga_{0.6}As$ cladding layer 21, which is disposed on the active layer 14 in the first embodiment, is replaced by a p type AlGaAs/AlAs superlattice layer 23 containing zinc (which promotes disordering). Reference numeral 24 denotes a p type AlGaAs disordered layer which is produced when the p type AlGaAs/AlAs superlattice layer 23 is disordered by annealing.

The production process of this third embodiment is the same as that of the first embodiment except that the zinc doped p type AlGaAs/AlAs superlattice layer 23 disposed in place of the AlGaAs cladding layer 21 is disordered except where Be ions are implanted. The layer 23 exhibits almost the same function as the AlGaAs cladding layer 21, thereby resulting in the same effects as in the first embodiment.

While in the above-illustrated first to third embodiments AlGaAs material is employed, AlGaInP or InGaAsP may be employed.

As is evident from the foregoing description, according to the present invention, a superlattice layer current path which has a high reflectance is disposed adjacent the circular mesa groove and between an active layer and an etching stopping layer, and a current blocking disordered layer having a low reflectance is disposed beyond the circular mesa groove portion. Therefore, a semiconductor laser device having a low threshold current and oscillating in the fundamental mode with a high light intensity distribution at the central portion of the active layer, is obtained.

According to a further aspect of the present invention, impurity ions which suppress the disordering of the superlattice and are activated to produce second conductivity type conductivity after annealing are implanted from the first conductivity type substrate side where a groove is disposed so that the ions reach the second conductivity type cladding layer on the active layer at the groove portion and remain in the substrate. Therefore, a laser structure having a superlattice layer region as a current path and a disordered region surrounding the superlattice layer to block current is easily realized.

What is claimed is:

1. A method of producing a semiconductor laser device comprising:
    successively epitaxially growing an etching stopping layer, a first conductivity type superlattice structure, a second conductivity type cladding layer, an active layer, and a first conductivity type cladding layer on a substrate;
    producing a current confinement structure in said first conductivity type cladding layer;
    etching a groove in said substrate reaching said etching stopping layer opposite said current confinement structure;
    implanting dopant impurity ions which suppress disordering of said superlattice structure and are activated to a second conductivity type by annealing in the superlattice structure through said groove so that said dopant impurity ions reach said second conductivity type cladding layer opposite said groove but do not reach said first conductivity type cladding layer and remain in said substrate at the side walls of said groove; and
    annealing to disorder said superlattice structure at a region beyond the groove where said dopant impurity ions are not implanted and converting the region of the superlattice structure opposite the groove to the second conductivity type.

2. A method of producing a semiconductor laser device as defined in claim 1 wherein said substrate comprises n type GaAs including growing AlGaAs as said etching stopping layer and AlGaAs/AlAs layers containing Si as said superlattice structure.

3. A method of producing a semiconductor laser device as defined in claim 2 including growing p type AlGaAs as said second conductivity type cladding layer.

4. A method of producing a semiconductor laser device as defined in claim 2 including growing a Be doped AlGaAs/AlAs superlattice as said second conductivity type cladding layer.

5. A method of producing a semiconductor laser device as defined in claim 2 wherein said second cladding layer comprises a Zn doped AlGaAs/AlAs superlattice layer including disordering the second cladding layer by annealing.

6. A method of producing a semiconductor laser device as defined in claim 2 including implanting Be as said dopant impurity ions.

* * * * *